(12) United States Patent
Qu

(10) Patent No.: US 9,125,314 B2
(45) Date of Patent: Sep. 1, 2015

(54) PRINTED CIRCUIT BOARD

(71) Applicant: CELESTICA TECHNOLOGY CONSULTANCY (SHANGHAI) CO. LTD, Shanghai (CN)

(72) Inventor: Li Juan Qu, Shanghai (CN)

(73) Assignee: CELESTICA TECHNOLOGY CONSULTANCY (SHANGHAI) CO. LTD., Shanghai (CN)

( * ) Notice: Subject to any disclaimer, the term of this patent is extended or adjusted under 35 U.S.C. 154(b) by 201 days.

(21) Appl. No.: 13/914,108

(22) Filed: Jun. 10, 2013

(65) Prior Publication Data
US 2013/0327565 A1    Dec. 12, 2013

(30) Foreign Application Priority Data
Jun. 8, 2012 (CN) .......................... 2012 1 0189600

(51) Int. Cl.
*H05K 1/11* (2006.01)
(52) U.S. Cl.
CPC ..................................... *H05K 1/116* (2013.01)
(58) Field of Classification Search
CPC ....... H05K 1/111; H05K 1/112; H05K 1/115; H05K 1/116; H05K 3/429
USPC .......................................... 174/261, 262, 266
See application file for complete search history.

(56) References Cited

U.S. PATENT DOCUMENTS

| | | | |
|---|---|---|---|
| 2007/0089292 A1* | 4/2007 | Tourne et al. | 29/852 |
| 2009/0057912 A1* | 3/2009 | Kheng | 257/774 |
| 2009/0122498 A1* | 5/2009 | Lan et al. | 361/778 |
| 2010/0012366 A1* | 1/2010 | Takeda | 174/261 |

* cited by examiner

Primary Examiner — Hoa C Nguyen
(74) Attorney, Agent, or Firm — Oliff PLC

(57) ABSTRACT

A printed circuit board includes: an insulating substrate, and a patterned conductive layer having a signal line and fixed on the insulating substrate, where signal lines on different planes of the patterned conductive layer are electrically connected to a via hole through a pad. An inner wall of the via hole is formed of a conductive bar and an insulating bar that penetrate the via hole; the pad is at an edge of the via hole and is connected to the conductive bar; the pad has an unclosed structure. In the printed circuit board according to the present invention, the size of the pad is significantly reduced by arranging the pad at partial edge of the via hole, thereby effectively improving a layout density of the patterned conductive layer, hence reducing the size of the printed circuit board, and satisfying the market demand for smaller electronic products.

7 Claims, 5 Drawing Sheets

Zero phase signal line 180° signal line

PRINTED CIRCUIT BOARD

BACKGROUND OF THE PRESENT INVENTION

1. Field of Invention The present invention relates to a printed circuit board.

2. Description of Related Arts

The printed circuit board employs an insulating board as a base material, and is cut into a certain size. At least one patterned conductive layer is attached onto the board and holes are arranged thereon (for example, component holes, fastening holes, and plated-through holes). The board is used for replacing the base on which electronic devices are mounted, and for connecting the electronic elements. This type of board is made by means of electronic lithography, and is therefore referred to as a printed circuit board. The printed circuit board is an important electronic component, and supports electronic devices.

Electronic products are becoming smaller in size and have more functions, and the size of the printed circuit board is also becoming smaller. However, the number of via holes and the interference between signal lines have constantly restricted the size reduction of the printed circuit board; hence, it is difficult to make a breakthrough in substantial size reduction of the printed circuit board. For example, if the pad at the edge of the via hole is too close to the signal line arranged near the pad, interference will occur. So, a certain distance should be maintained between the via hole and the signal line. For another example, the via hole of the printed circuit board is closely related to the circuit connections of the electronic devices arranged on the printed circuit board and/or the circuit connections among multiple layers of printed circuit boards. Therefore, each circuit connection requires a via hole; as a result, the size and the number of via holes further restrict the size reduction of the printed circuit board.

Therefore, to improve the via hole so as to effectively reduce the size of the printed circuit board is a problem that needs to be solved by persons skilled in the art.

SUMMARY OF THE PRESENT INVENTION

Accordingly, an object of the present invention is to provide a printed circuit board. The printed circuit board comprises an insulating substrate, and a patterned conductive layer having a signal line and fixed on the insulating substrate, where signal lines on different planes of the patterned conductive layer are electrically connected to a via hole through a pad; an inner wall of the via hole is formed of a conductive bar and an insulating bar that penetrate the via hole; the pad is at an edge of the via hole and is connected to the conductive bar; the pad has an unclosed structure. It can be considered as partial plated through hole/via.

Preferably, the via hole has one or more conductive bars therein, and one or more pads are disposed at the edge of the via hole; two adjacent conductive bars are spaced by the insulating bar; and two adjacent pads are insulated from each other.

Preferably, the number of the conductive bars in the via hole is two, and the two conductive bars are symmetrically disposed with a central axis of the via hole as a symmetry axis.

Preferably, one conductive bar in the via hole is connected to one signal line of a differential signal line pair through the pad connected thereto; another conductive bar in the via hole is connected to another signal line of the differential signal line pair through the pad connected thereto.

Preferably, one conductive bar in the via hole is connected to the signal line through the pad connected thereto; another conductive bar in the via hole is connected to a ground signal line through the pad connected thereto.

Preferably, a distance between the pad at the edge of the via hole and the signal line arranged near the via hole is greater than a distance between a part of the edge of the via hole without pad and the signal line arranged near the via hole.

Preferably, one differential signal line in a differential signal line pair is connected to the conductive bar in one via hole through the pad, and another differential signal line is connected to the conductive bar in another via hole through the pad; one differential signal line and the conductive bar connected thereto are symmetrical to the other differential signal line and the conductive bar connected thereto; each of the two via holes further has another conductive bar connected to a ground signal line.

Preferably, the conductive bar occupies an area from 20° to 160° of the inner wall of the via hole.

Preferably, the pad occupies an area from 20° to 160° of the edge of the via hole.

As described above, the printed circuit board having a via hole according to the present invention has the following beneficial effects: the signal line and the conductive bar on the inner wall of the via hole are connected by the pad arranged at a part of the edge of the via hole, so the space occupied by the pad and the conductive bar is effectively reduced, thereby reducing the size of the printed circuit board. In addition, multiple conductive bars arranged on the inner wall of the via hole can share one via hole to transmit various signals; therefore, the problem in the prior art that one via hole can only transmit one signal is solved; the number of via holes is effectively decreased, and the size of the printed circuit board is further reduced. Furthermore, in the present invention, a distance between the pad at the edge of the via hole and the signal line arranged near the via hole is greater than a distance between a part of the edge of the via hole without pad and the signal line arranged near the via hole, so the distance between signal lines that transmit different signals in the patterned conductive layer is significantly improved. The distance between the signal lines is increased through the width of the via hole, so that the crosstalk between different signals is reduced, and the signal transmission quality is improved. In addition, in the present invention, when one differential signal line pair needs to transmit signals with the patterned conductive layer of other planes through a via hole, the signal line pair is respectively connected to two conductive bars on the inner wall of a via hole, thereby effectively reducing the parallel variation between the signal lines and improving the transmission quality of differential signals. Further, in the present invention, the signal line and a ground signal line on the circuit thereof are respectively connected two conductive bars on the inner wall of a via hole, so the signal is close to a ground return path as much as possible, and the signal loss is reduced; meanwhile, the impedance continuity of high speed signals is ensured, and when the high speed signal reaches a layer transition position of the via hole, signal reflection at an impedance discontinuity point is reduced.

Figure 1:
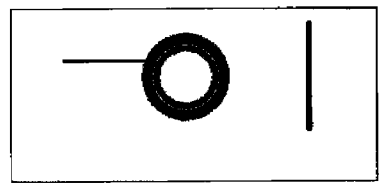
FIG. 1 is a view of a patterned conductive layer of a printed circuit board in the prior art.

LIST OF THE NUMERALS 1. printed circuit board
11. insulating substrate
12, 12F, 12A, 12B, 12C, 12D, 12E. via hole
13, 13F1, 13F2, 13F3, 13A1, 13A2, 13B1, 13B2, 13C, 13D1, 13D2, 13E1, 13E2. conductive bar
14, 14F1, 14F2, 14F3. insulating bar
15. patterned conductive layer
16, 16A1, 16A2, 16B1, 16C1, 16C2, 16D1, 16D2, 16E1, 16E2. signal line
17, 17A1, 17A2, 17B1, 17B2, 17C1, 17C2, 17D1, 17D2, 17E1, 17E2. pad

DETAILED DESCRIPTION OF THE PREFERRED EMBODIMENTS

The implementation manners of the present invention are described in detail through specific embodiments. Persons skilled in the art could easily understand other advantages and efficacies of the present invention according to the content disclosed in the specification. The present invention may also be implemented or applied in other specific implementation manners. Modifications or variations can be made on details of the specification based on different points of views and without departing from the spirit of the present invention.

Referring to FIG. 4 to FIG. 9, it should be noted that the drawings provided in the embodiment are merely schematic representations of basic ideas of the present invention. The drawings only show components related to the present invention, and are not drawn according to the number, shapes, and sizes of components in practical implementations. The patterns, number, and ratio of the components in practical implementation may vary randomly, and the component layout pattern may be more complex.

Figure 4:
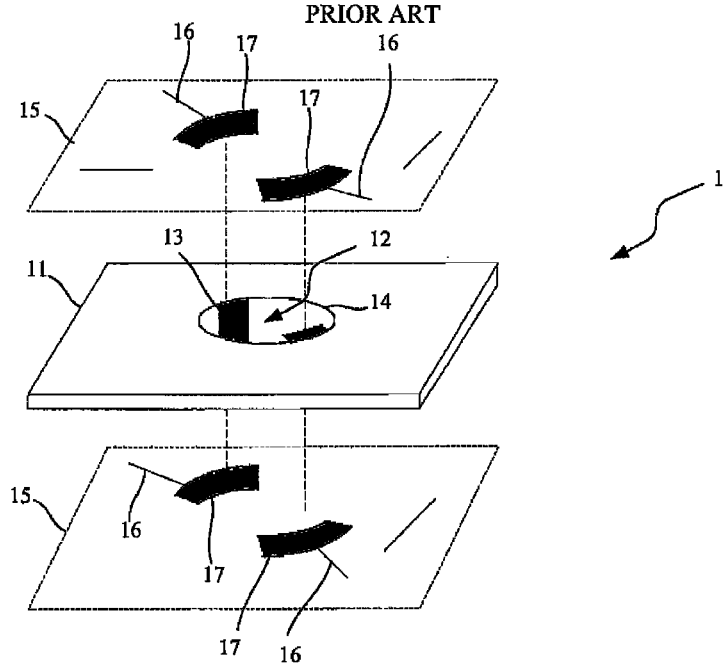
FIG. 4 is a schematic structural view of a printed circuit board consistent with the present invention.

As shown in FIG. 4, a printed circuit board 1 comprises a patterned conductive layer 15 and an insulating substrate 11.

The insulating substrate 11 has a via hole 12. The insulating substrate 11 is any substrate made of an insulating material and applicable to the printed circuit board 1, which comprises but is not limited to a rigid insulating substrate 11, a flexible insulating substrate 11, and the like. The via hole 12 is used for forming a blind hole, a buried hole, or a through hole, etc. The via hole 12 may be in any shape, which comprises but is not limited to a round shape, a square shape, or a T shape.

Figure 5:
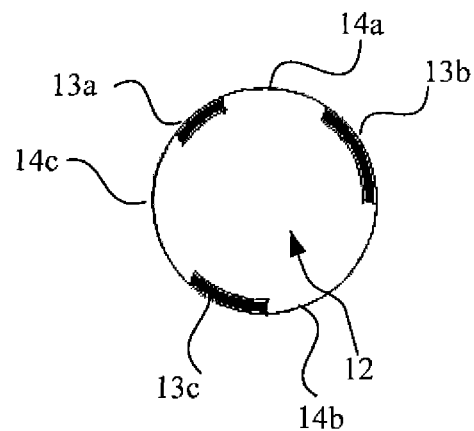
FIG. 5 is a schematic structural view of an embodiment of an inner wall of a via hole of a printed circuit board consistent with the present invention.

An inner wall of the via hole 12 is formed of a conductive bar 13 and an insulating bar 14 that penetrate the via hole 12. The material of the conductive bar 13 comprises but is not limited to copper foil. The insulating bar 14 is preferably an inner side wall of the insulating substrate 11. More preferably, the conductive bar 13 occupies an area from 20° to 160° of the inner wall of the via hole 12. Preferably, the via hole 12 has one or more conductive bars 13 therein, and two adjacent conductive bars 13 are spaced by the insulating bar 14. For example, as shown in FIG. 5, three conductive bars 13F1, 13F2, and 13F3 are arranged on the inner wall of the via hole 12F, where the conductive bar 13F1 and the conductive bar 13F2 are spaced by an insulating bar 14F1; the conductive bar 13F2 and the conductive bar 13F3 are spaced by an insulating bar 14F2; the conductive bar 13F3 and the conductive bar 13F1 are spaced by an insulating bar 14F3.

Preferably, the via hole 12 has two conductive bars 13 therein, and the two conductive bars 13 are symmetrically disposed with the central axis of the via hole 12 as a symmetry axis.

Manners that the inner wall of the via hole 12 is formed of the conductive bar 13 and the insulating bar 14 which penetrate the via hole 12 comprise but are not limited to: 1) plating copper foil onto the inner wall of the via hole 12 by using an electroplating tool, and then removing partial conductive material through chemical etching, so as to obtain the structure in which the conductive bar 13 and the insulating bar 14 penetrate the via hole 12; and 2) electroplating a conductive material at a designated position on the inner wall of the via hole 12 by using a mould, so as to obtain the structure in which the conductive bar 13 and the insulating bar 14 penetrate the via hole 12.

The patterned conductive layer 15 has signal lines 16 and pads 17, and is fixed on the insulating substrate 11. The patterned conductive layer 15 comprises any conductive layer that is made of a metal material based on a preset circuit layout pattern, and is capable of providing electric power or signals for devices arranged on the printed circuit board 1, where the material of the patterned conductive layer 15 comprises but is not limited to copper foil.

The signal line 16 is used for transmitting high speed signals, differential signals, ground signals, and the like, where the high speed signal refers to a signal whose transmission delay is less than ⅙ of rise time thereof, and the high speed signal comprises but is not limited to a double data rate (DDR) signal and a universal serial bus (USB) signal.

The pad 17 is located at the edge of the via hole 12 and is connected to the conductive bar 13. The pad 17 has an unclosed structure. The shape of the pad 17 comprises but is not limited to: a C shape, a U shape, an L shape, and an arc shape. Preferably, the pad 17 occupies an area from 20° to 160° of the edge of the via hole 12. The width of the pad 17 and the conductive bar 16 may be the same or different. The number of the pads 17 depends on the number of the conductive bars 13. When the number of the pads 17 is more than one, two adjacent pads 17 are insulated from each other.

It should be noted that, persons skilled in the art should understand that the patterned conductive layer 15 may be fixed on one side of the insulating substrate 11, and may also be fixed on both sides of the insulating substrate 11. Different planes of the patterned conductive layer 15 are insulated from each other by the insulating substrate 11.

It should be also noted that, persons skilled in the art should understand that the manner for fixing the patterned conductive layer 15 on the insulating substrate 11 is not elaborated herein. For example, a metal material is plated on the insulating substrate 11 through electroplating and based on a preset circuit layout pattern, to obtain the patterned conductive layer 15. For another example, a metal material is first plated all over the insulating substrate 11, and then partial metal material is removed through chemical etching and based on a preset circuit layout pattern until the insulating substrate 11 is exposed, to obtain a conductive layer consistent with the preset pattern.

The printed circuit board 1 is described in detail below with reference to the examples shown in FIG. 6 to FIG. 9.

As a preferable solution, two conductive bars in the via hole 12 are respectively connected to a differential signal line pair through two pads.

Figure 6:
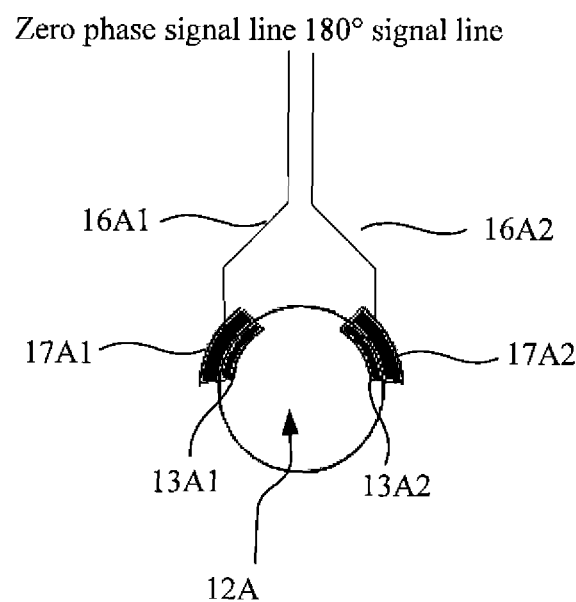
FIG. 6 is a schematic structural view of another embodiment of a printed circuit board consistent with the present invention.

As shown in FIG. 6, the via hole 12A has a conductive bar 13A1 and a conductive bar 13A2 therein; a signal line 16A1 and a signal line 16A2 form a differential signal line pair. The pad 17A1 and the pad 17A2 are connected to the conductive bar 13A1 and the conductive bar 13A2, wherein the signal line 16A1 is connected to the pad 17A1, and the signal line 16A2 is connected to the pad 17A2. The signal line 16A1 and the conductive bar 13A1 are symmetrical to the signal line 16A2 and the conductive bar 13A2 about the central axis of the via hole 12A.

It should be noted that persons skilled in the art should understand that the positions of the conductive bar 13A1 and the conductive bar 13A2 are merely an example but are not intended to limit the present invention.

As another preferable solution, one conductive bar in the via hole is connected to a signal line through the pad connected thereto; another conductive bar in the via hole is connected to a ground signal line through the pad connected thereto.

Figure 7:
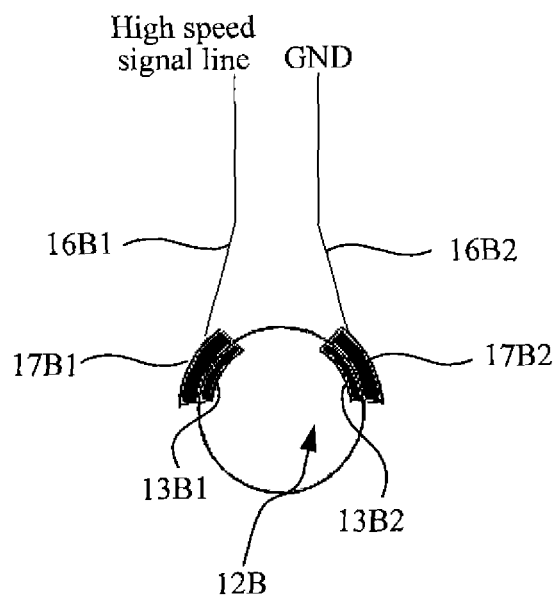
FIG. 7 is a schematic structural view of still another embodiment of a printed circuit board consistent with the present invention.

FIG. 7 shows a conductive bar 13B1 and a conductive bar 13B2 in the via hole 12B; a signal line 16B1 is used for transmitting high speed signals, and a signal line 16B2 is a ground signal line (GND) close to the signal line 16B1. The signal line 16B1 is connected to the conductive bar 13B1 through a pad 17B1, and the signal line 16B2 is connected to the conductive bar 13B2 through a pad 17B2. Signals are transmitted to signal lines on the patterned conductive layers 15 of different planes.

As another preferable solution, a distance between the pad at the edge of the via hole and the signal line arranged near the via hole is greater than a distance between a part of the edge of the via hole without pad and the signal line arranged near the via hole.

Figure 8:
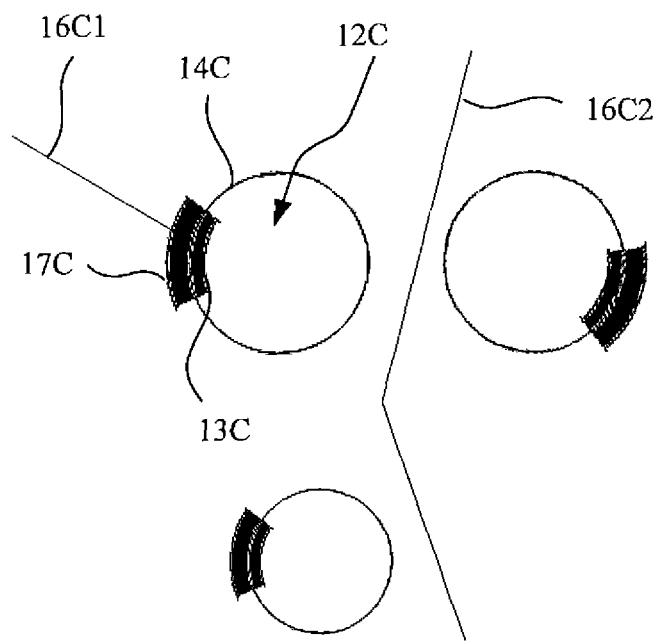
FIG. 8 is a schematic structural view of still another embodiment of a printed circuit board consistent with the present invention.

As shown in FIG. 8, a signal line 16C1 and a signal line 16C2 are arranged near the via hole 12C. The signal line 16C1 is connected to a conductive bar 13C through a pad 17C, so as to reduce the crosstalk between the signals transmitted by the signal line 16C1 and the signal line 16C2; a distance between the pad 17C and the signal line 16C2 is greater than a distance between a part of the edge of the via hole 12C without pad and the signal line 16C2.

As another preferable solution, one differential signal line in a differential signal line pair is connected to the conductive bar in one via hole through the pad, and another differential signal line is connected to the conductive bar in another via hole through the pad; wherein one differential signal line and the conductive bar connected thereto are symmetrical to the other differential signal line and the conductive bar connected thereto; each of the two via holes further has another conductive bar connected to a ground signal line.

Figure 9:
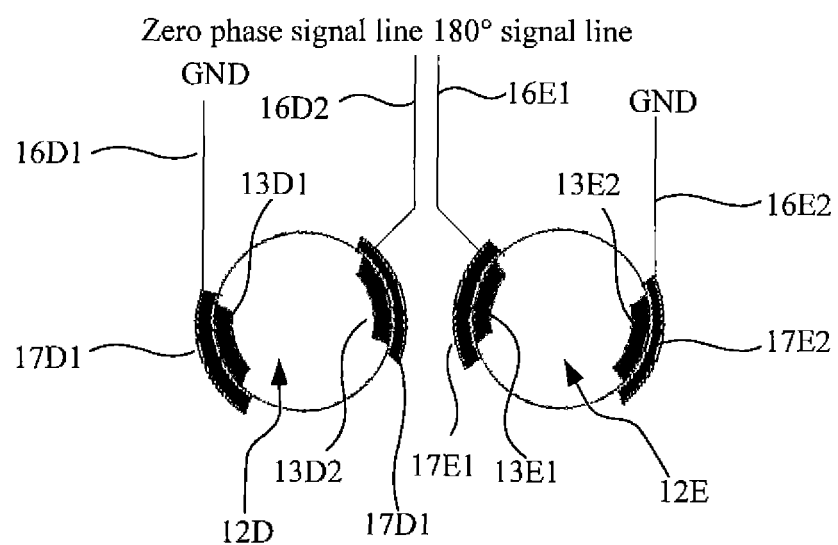
FIG. 9 is a schematic structural view of still another embodiment of a printed circuit board consistent with the present invention.

As shown in FIG. 9, a via hole 12D has a conductive bar 13D1 and a conductive bar 13D2 therein. A via hole 12E has a conductive bar 13E1 and a conductive bar 13E2 therein. A signal line 16D2 and a signal line 16E1 form a differential signal line pair 16; a signal line 16D1 and a signal line 16E2 are respectively ground signal lines (GND) that form the circuits of the signal line 16D2 and the signal line 16E1. The signal line 16D1 is connected to the conductive bar 13D1, the signal line 16D2 is connected to the conductive bar 13D2, the signal line 16E1 is connected to the conductive bar 13E1, and the signal line 16E2 is connected to the conductive bar 13E2. The signal line 16D2 and the conductive bar 13D2 are symmetrical to the signal line 16E1 and the conductive bar 13E1 about the central axis of the via hole 12D.

It should be noted that, persons skilled in the art should understand that the number and positions of the conductive bars on the inner wall of the via hole shown in FIG. 4 to FIG. 9 are merely an example, and are not intended to limit the present invention.

In conclusion, in the printed circuit board according to the present invention, the space occupied by the pad and the conductive bar is effectively reduced by arranging the pad at partial edge of the via hole to connect the signal line and the conductive bar on the inner wall of the via hole, thereby reducing the size of the printed circuit board.

In addition, multiple conductive bars arranged on the inner wall of the via hole can share one via hole to transmit various signals; therefore, the problem in the prior art that one via hole can only transmit one signal is solved; the number of via holes is effectively reduced, and the size of the printed circuit board is further reduced.

Furthermore, compared with FIG. 1, in the present invention, a distance between the pad at the edge of the via hole and the signal line arranged near the via hole is greater than a distance between a part of the edge of the via hole without pad and the signal line arranged near the via hole, so the distance between signal lines that transmit different signals in the patterned conductive layer is significantly improved. The distance between the signal lines is increased through the width of the via hole, so that the crosstalk between different signals is reduced, and the signal transmission quality is improved.

Figure 2:
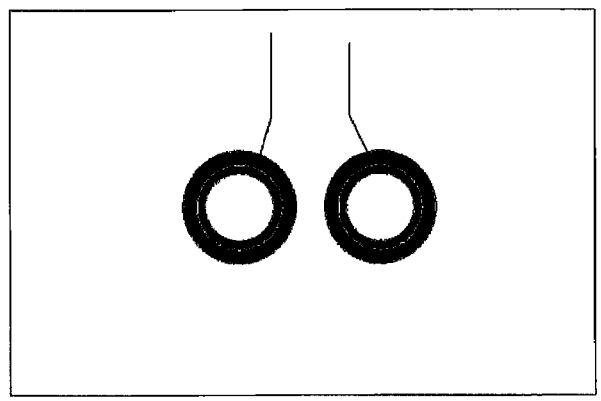
FIG. 2 is another view of a patterned conductive layer of a printed circuit board in the prior art.
Figure 3:
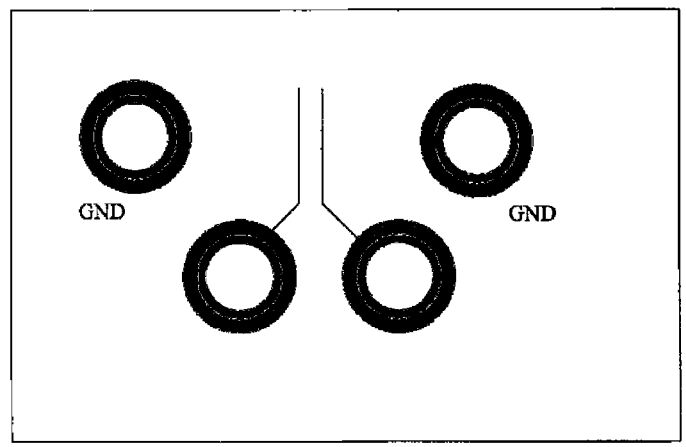
FIG. 3 is still another view of a patterned conductive layer of a printed circuit board in the prior art.

In addition, compared with FIG. 2 and FIG. 3, in the present invention, when one differential signal line pair needs to transmit signals with the patterned conductive layer of another plane through a via hole, the signal line pair is respectively connected to two conductive bars on the inner wall of a via hole, thereby effectively reducing the parallel variation between the signal lines and improving the transmission quality of differential signals.

Furthermore, compared with FIG. 3, in the present invention, the signal line and a ground signal line on the circuit thereof are respectively connected two conductive bars on the inner wall of a via hole, so the signal is close to a ground return path as much as possible, and the signal loss is decreased; meanwhile, the impedance continuity of high speed signals is ensured, and when the high speed signal reaches a layer transition position of the via hole, signal reflection at an impedance discontinuity point is reduced.

Therefore, the present invention overcomes disadvantages in the prior art and thus has a high industrial value.

The above embodiments are only to illustrate the principle and efficacies of the present invention, and are not intended to limit the scope of the present invention. All modifications and variations completed by those with ordinary skill in the art without departing from the spirit and scope of the present invention shall fall within the scope of the appended claims of the present invention.

What is claimed is:

1. A printed circuit board, comprising:
   an insulating substrate, and
   a patterned conductive layer having a signal line and fixed on the insulating substrate,
   wherein signal lines on different planes of the patterned conductive layer are electrically connected to a via hole through a pad; an inner wall of the via hole is formed of a conductive bar and an insulating bar that penetrate the via hole; the pad is at an edge of the via hole and is connected to the conductive bar; the pad has an unclosed structure;

the via hole has one or more conductive bars therein, and one or more pads are disposed at the edge of the via hole; two adjacent conductive bars are spaced by the insulating bar; and two adjacent pads are insulated from each other; and one differential signal line in a differential signal line pair is connected to the conductive bar in one via hole through the pad connected thereto, and another differential signal line is connected to the conductive bar in another via hole through another pad connected thereto; the one differential signal line and the conductive bar connected thereto are symmetrical to the other differential signal line and the conductive bar connected thereto; each of the two via holes further has another conductive bar connected to a ground signal line.

2. The printed circuit board according to claim 1, wherein the number of the conductive bars in the via hole is two, and the two conductive bars are symmetrically disposed with the central axis of the via hole as a symmetry axis.

3. The printed circuit board having a via hole according to claim 2, wherein one conductive bar in the via hole is connected to one signal line of a differential signal line pair through the pad connected thereto; another conductive bar in the via hole is connected to another signal line in the differential signal line pair through the pad connected thereto.

4. The printed circuit board according to claim 2, wherein one conductive bar in the via hole is connected to the signal line through the pad connected thereto; and another conductive bar in the via hole is connected to a ground signal line through the pad connected thereto.

5. The printed circuit board according to claim 1, wherein a distance between the pad at the edge of the via hole and signal line arranged near the via hole is greater than a distance between a part of the edge of the via hole without pad and the signal line arranged near the via hole.

6. The printed circuit board according to claim 1, wherein the conductive bar occupies an area from 20° to 160° of the inner wall of the via hole.

7. The printed circuit board according to claim 1, wherein the pad occupies an area from 20° to 160° of the edge of the via hole.

* * * * *